United States Patent
Nowak

(10) Patent No.: US 7,314,794 B2
(45) Date of Patent: Jan. 1, 2008

(54) LOW-COST HIGH-PERFORMANCE PLANAR BACK-GATE CMOS

(75) Inventor: Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 22 days.

(21) Appl. No.: 11/161,534

(22) Filed: Aug. 8, 2005

(65) Prior Publication Data

US 2007/0029620 A1   Feb. 8, 2007

(51) Int. Cl.
*H01L 21/8238* (2006.01)

(52) U.S. Cl. .................... 438/231; 438/45; 438/369; 438/524; 438/914

(58) Field of Classification Search .............. 438/45, 438/231, 232, 369, 370, 524, 561, 914
See application file for complete search history.

(56) References Cited

U.S. PATENT DOCUMENTS

| 5,580,802 | A | | 12/1996 | Mayer et al. | |
|---|---|---|---|---|---|
| 5,759,901 | A | * | 6/1998 | Loh et al. ............... | 438/305 |
| 5,877,049 | A | * | 3/1999 | Liu et al. ............... | 438/224 |
| 5,891,776 | A | * | 4/1999 | Han et al. ............... | 438/274 |
| 6,071,803 | A | | 6/2000 | Rutten et al. | |
| 6,074,899 | A | | 6/2000 | Voldman | |
| 6,348,372 | B1 | * | 2/2002 | Burr ........................ | 438/223 |
| 6,376,287 | B1 | | 4/2002 | Dennison et al. | |
| 6,611,023 | B1 | * | 8/2003 | En et al. .................. | 257/350 |
| 6,812,527 | B2 | * | 11/2004 | Dennard et al. .......... | 257/347 |
| 6,838,329 | B2 | * | 1/2005 | Weber et al. ............. | 438/217 |
| 6,900,101 | B2 | * | 5/2005 | Lin ........................... | 438/276 |
| 7,018,873 | B2 | * | 3/2006 | Dennard et al. .......... | 438/149 |
| 2004/0046208 | A1 | * | 3/2004 | Dennard et al. .......... | 257/347 |
| 2004/0169227 | A1 | | 9/2004 | Wei et al. | |
| 2005/0037582 | A1 | * | 2/2005 | Dennard et al. .......... | 438/281 |
| 2005/0048703 | A1 | * | 3/2005 | Dennard et al. .......... | 438/149 |
| 2005/0253197 | A1 | * | 11/2005 | Tokushige ................ | 257/347 |

FOREIGN PATENT DOCUMENTS

EP   0 905 761 A2   3/1999

OTHER PUBLICATIONS

Yan, et al., "Sealing the SI MOSFET: From Bulk to SOI to Bulk", IEEE Transactions on Electron Devices, vol. 39, No. 7, Jul. 7, 1992, pp. 1704-1710.

* cited by examiner

*Primary Examiner*—Fernando L. Toledo
(74) *Attorney, Agent, or Firm*—Scully, Scott, Murphy & Presser, P.C.; Anthony J. Canale

(57) ABSTRACT

A method of fabricating a high-performance planar back-gate CMOS structure having superior short-channel characteristics and reduced capacitance using processing steps that are not too lengthy or costly is provided. Also provided is a high-performance planar back-gate CMOS structure that is formed utilizing the method of the present invention. The method includes forming an opening in an upper surface of a substrate. Thereafter, a dopant region is formed in the substrate through the opening. In accordance with the inventive method, the dopant region defines a back-gate conductor of the inventive structure. Next, a front gate conductor having at least a portion thereof is formed within the opening.

11 Claims, 13 Drawing Sheets

LOW-COST HIGH-PERFORMANCE PLANAR BACK-GATE CMOS

FIELD OF THE INVENTION

The present invention relates to semiconductor device fabrication, and more particularly to a low-cost method of fabricating a planar back-gate complementary metal oxide semiconductor (CMOS) structure having low parasitic capacitance. The present invention also relates to a planar back-gate CMOS structure that has low parasitic capacitance.

BACKGROUND OF THE INVENTION

Over the past twenty-five years or so, the primary challenge of very large scale integration (VLSI) has been the integration of an ever-increasing number of CMOS devices with high yield and reliability. This was achieved mainly in the prior art by scaling down the channel length of the CMOS devices, without excessive short-channel effects. As is known to one skilled in the art, short-channel effects are the decrease of threshold voltage Vt in short channel devices due to two-dimensional electrostatic charge sharing between the gate and the source/drain regions.

To scale the channel lengths of CMOS devices without excessive short-channel effects, the gate oxide thickness has to be reduced, while increasing the channel-doping concentration. However, Yan, et al., "Scaling the Si MOSFET: From bulk to SOI to bulk", IEEE Trans. Elect. Dev., Vol. 39, p 1704, July 1992, have shown that to reduce short-channel effects for sub-0.05 micron metal oxide semiconductor field effect transistors (MOSFETs), it is important to have a backside-conducting layer present in the structure that screens the drain field away from the channel. The Yan, et al. results show that double-gated MOSFETs and MOSFETs with a top gate and a backside gated ground plane are more immune to short-channel effects and hence can be scaled to shorter dimensions than conventional MOSFETs.

Although planar back-gate technology can provide improved performance through superior short-channel characteristics, such devices have either exhibited excessive parasitic capacitances leading to poor active power and speed behaviors, or have required incredibly lengthy and expensive processes which are unlikely to provide sufficient manufacturing yield.

In view of the above, there is a continued need for providing a method for fabricating a planar back-gate CMOS having low parasitic capacitance which provides good active power and speed behaviors using a methodology that is not too lengthy or costly.

SUMMARY OF THE INVENTION

The present invention provides a method of fabricating a high-performance planar back-gate CMOS structure having superior short-channel characteristics and reduced capacitance using processing steps that are not too lengthy or costly. In one embodiment of the present invention, an ultrathin (on the order of about 10 nm or less) silicon-on-insulator process is provided in which a poly-buffered local oxidation of silicon thinning step and a self-aligned back gate implant step are employed to form a self-aligned back-gate. By "self-aligned" it is meant that the implanted back-gate has a lateral dimension that is substantially defined by an opening provided in the upper surface of a substrate. Some lateral out-diffusion of the implanted back-gate beyond edges of the overlying opening may occur due to various thermal processes that occur in the present invention.

In broad terms, the method of the present invention includes the steps of:

forming an opening in an upper surface of a substrate;

forming a dopant region in said substrate through said opening, said dopant region defining a back-gate conductor; and forming a front gate conductor having at least a portion thereof within said opening.

In addition to the method broadly described above, the present invention also provides a planar back-gate CMOS that exhibits superior short-channel characteristics and low parasitic capacitance. By "superior short-channel characteristics" it is meant, that deleterious effects, such as, sub-threshold swing and Drain-Induced Barrier Lowering (DIBL) are of minor effect in the device operation. By "low parasitic capacitance" it is meant that capacitances not directly required to operate the transistor, such as gate-to-drain capacitance (extrinsic of the channel) are small (e.g., not more than 20%) compared to the direct gate-to-channel capacitances; in particular, the drain-to-back-gate and source-to-back-gate capacitances are much less than the intrinsic drain-to-gate capacitance of the device.

Specifically, and in broad terms, the planar back-gate CMOS structure of the present invention comprises:

a substrate having a back-gate conductor whose lateral dimension is substantially defined by an opening located in an upper surface of said substrate;

a front gate conductor having a portion thereof that is located within said opening; and source/drain regions located adjacent to opposite sides of said front gate conductor.

DETAILED DESCRIPTION OF THE INVENTION

Figure 1:
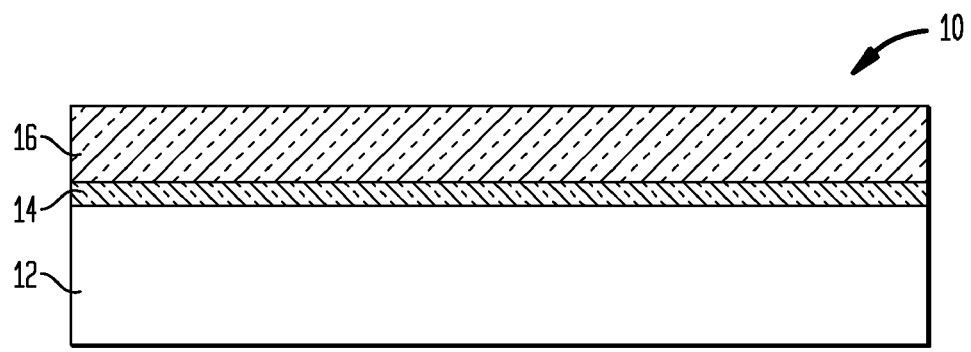
FIG. 1 is a pictorial representation (through a cross sectional view) illustrating a preferred substrate that is employed in the present invention.

The present invention, which provides a method for forming a high-performance planar back-gate CMOS and the resultant back-gate structure, will now be described in greater detail by referring to the drawings that accompany the present application. It is noted that the drawings of the present application are provided for illustrative purposes and thus the structures shown therein are not drawn to scale. Also, it is observed that although the description that follows shows the formation of a single planar back-gate CMOS structure, the inventive method can be used to form a plurality of said planar back-gate CMOS structures on a surface of a single substrate.

The following description is made using a semiconductor-on-insulator substrate including either a top Si layer, or a top SiGe layer. Although the detailed discussion that follows employs a semiconductor-on-insulator substrate, the present invention is not limited to using such a substrate. Instead, bulk semiconductor substrates including, Si, SiGe, SiGeC, SiC, InAs, InP, GaAs and other III/V or II/IV compound semiconductors may be used in place of the semiconductor-on-insulator. In a preferable embodiment of the present invention, the initial substrate is a Si-containing substrate such as a Si-on-insulator (SOI).

Reference is first made to FIG. 1 which illustrates one type of substrate 10 that can be employed in the present invention. As shown, substrate 10 is a semiconductor-on-insulator that includes a bottom semiconductor layer 12, a buried insulating layer 14 and a top semiconductor layer 16. Typically, the top and bottom semiconductor layers are comprised of a Si-containing semiconductor such as, for example, Si, SiGe, SiC, SiGeC, Si/Si, Si/SiC, or Si/SiGeC. Typically, the top and bottom semiconductor layers are comprised of Si or SiGe, with Si being most preferred.

The buried insulating layer 14, which electrically isolates the top semiconductor layer 16 from the bottom semiconductor layer 12, may comprise a crystalline or non-crystalline oxide, or nitride. Preferably, the buried insulating layer 14 is comprised of an oxide. The buried insulating layer 14 may be continuous, as shown, or it may be non-continuous, e.g., the buried insulating layer 14 may comprise discrete and isolated regions or islands of insulating material surrounded by a semiconductor.

The semiconductor-on-insulator substrate 10 shown in FIG. 1 is fabricated using techniques well known to those skilled in the art. For example, the semiconductor-on-insulator may be formed by ion implantation and annealing, or by a layer transfer process. Alternatively, the substrate 10 can be formed by deposition of the various layers onto a bulk semiconductor substrate.

The thickness of the various layers of the initial semiconductor-on-insulator substrate 10 may vary depending on the process used in making the substrate. Typically, however, the top semiconductor layer 16 has a thickness from about 20 to about 200 nm, with a thickness from about 40 to about 70 nm being even more typical. The buried insulating layer 14 typically has a thickness from about 1 to about 100 nm, with a thickness from about 5 to about 20 nm being even more typical. The thickness of the bottom semiconductor layer 12 is inconsequential to the present invention. It is observed that the thicknesses provided above are typical ranges for each of the layers, which in no way limits the scope of the present application.

It is noted that if the initial semiconductor-on-insulator substrate 10 includes a top semiconductor layer 16 that is too thick, beyond the ranges specified above, the top semiconductor layer 16 can be subjected to a thinning process such as chemical mechanical polishing (CMP), grinding or oxidation and etching.

After providing a substrate such as the substrate 10 shown in FIG. 1, trench isolation regions 18 are formed into the substrate utilizing techniques well known in the art. Specifically, the trench isolation regions 18 are formed by lithography, etching a trench into the substrate and filling the trench with a trench dielectric material such as an oxide. The lithography step includes applying a photoresist (not shown) to the substrate, exposing the photoresist to a pattern, i.e., trench pattern, of radiation and developing the exposed resist using a conventional resist developer. The etching step may include a dry etching process such as, for example, reactive ion etching (RIE), ion beam etching, plasma etching or laser ablation. Alternatively, a chemical wet etch process may be used in forming the trench opening in the substrate.

Figure 2:
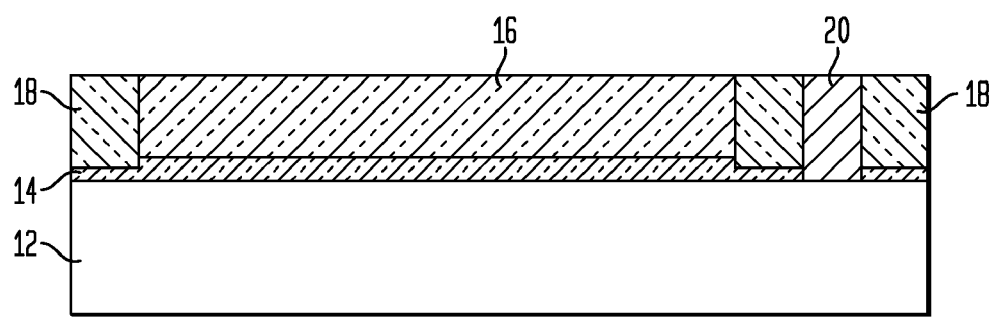
FIG. 2 is a pictorial representation (through a cross sectional view) illustrating the substrate of FIG. 1 after forming trench isolation regions and a trench contact.

The trench isolation regions 18 can extend down into the buried insulating layer 14, as shown, or they can have a bottom surface that is above the uppermost surface of the buried insulating layer 14. It is observed that a pair of neighboring trench isolation regions 18 can be used to form an isolated top semiconductor island 16 such as shown in FIG. 2.

Next, a trench contact 20 is formed by lithography, etching and trench fill, so as to provide an electrical contact from the top surface of the substrate to the bottom semiconductor layer 12. The trench contact 20 is filled with a conductive material such as, for example, doped polysilicon. The trench contact 20 will be used as an electrical pathway to the back-gate conductor to be subsequently formed in the substrate.

It is observed that a planarization process can follow the formation of both the trench isolation regions 18 and the trench contact 20, as desired. The planarization process includes CMP, grinding or a combination thereof.

Figure 3:
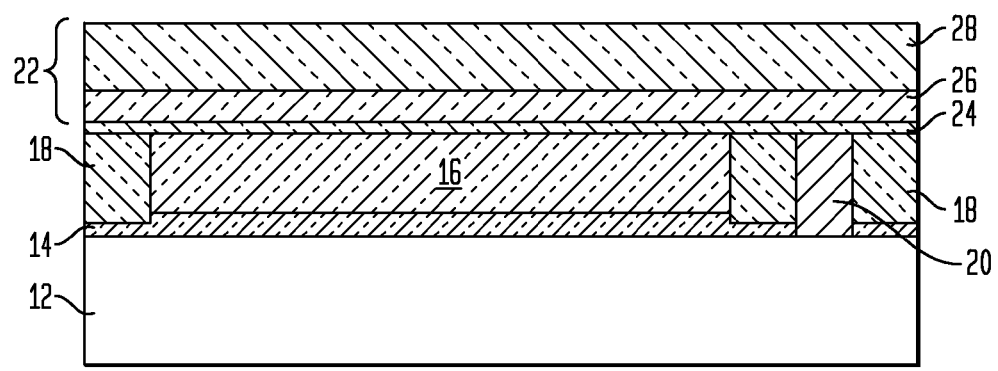
FIG. 3 is a pictorial representation (through a cross sectional view) illustrating the structure of FIG. 2 after forming a material stack on a surface of the substrate.

A material stack 22 is then formed on the upper surface of the substrate 10 providing the structure shown, for example, in FIG. 3. The material stack 22 may comprise any number of layers. Illustratively, the material stack 22 comprises a lower insulator 24, a polysilicon layer 26, and an upper insulator 28. The lower insulator 24 and the upper insulator 28 are comprised of different insulating materials. Typically, the lower insulator 24 of the material stack 22 is comprised of an oxide such as $SiO_2$ and the upper insulator 28 is comprised of a nitride such as $Si_3N_4$.

The material stack 22 is formed utilizing a combination of processes such as, for example, deposition and/or thermal growth. Suitable deposition processes that can be used in forming the various layers of the material stack 22 include chemical vapor deposition (CVD), plasma enhanced chemical vapor deposition (PECVD), atomic layer deposition, evaporation, chemical solution deposition or other like deposition processes. Epitaxy can be used in forming the polysilicon layer 26 of the material stack 22.

The overall thickness of material stack 22 may vary depending on the number of layers within the stack. Typically, the material stack 22 has a total thickness from about 15 to about 100 nm, with a thickness from about 20 to about 50 nm being even more typical. For the specific embodiment illustrated in which the material stack 22 comprises the lower insulator 24, the polysilicon layer 26, and the upper insulator 28, the following thickness ranges can be employed: lower insulator 24 having a thickness from about 4 to about 25 nm, polysilicon layer 26 having a thickness from about 3 to about 15 nm, and upper insulator 28 having a thickness from about 7 to about 60 nm.

After providing the material stack 22 on the substrate, an opening 30 is the formed into the material stack 22 and, optionally an upper surface of the substrate 10, e.g., an upper surface of top semiconductor layer 16, utilizing conventional lithography and etching. One or more etching processes (dry, wet or a combination thereof) can be used in forming the opening 30. The structure including the opening 30 is shown, for example, in FIG. 4.

Figure 4:
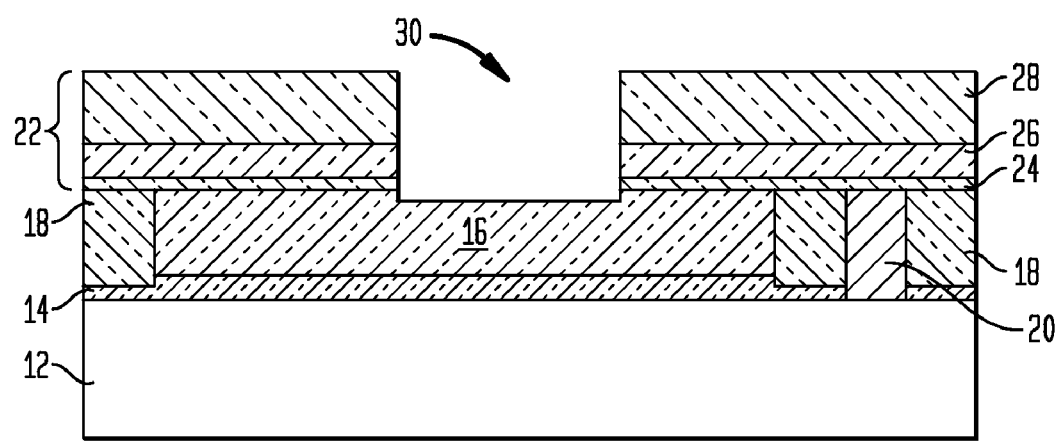
FIG. 4 is a pictorial representation (through a cross sectional view) illustrating the structure of FIG. 3 after forming an opening within the material stack and, optionally, an upper surface of the substrate.
Figure 5:
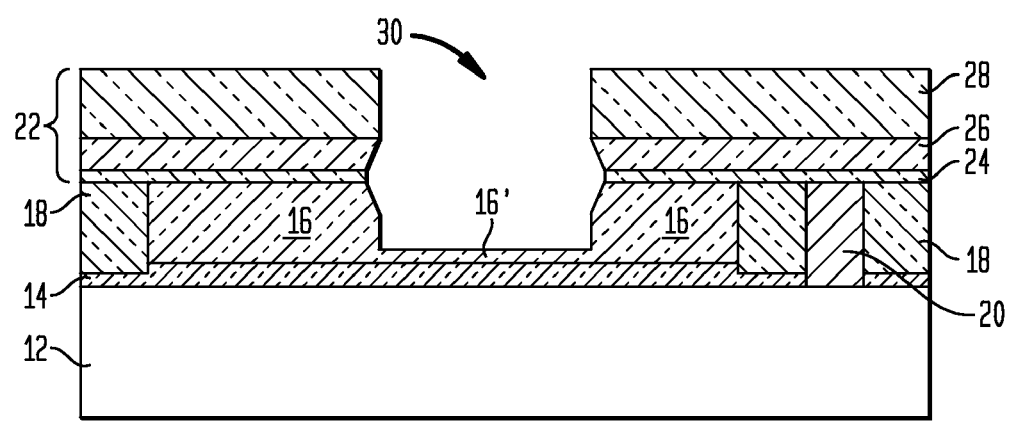
FIG. 5 is a pictorial representation (through a cross sectional view) illustrating the structure of FIG. 4 after performing a step that thins the exposed substrate.

Next, and as shown in FIG. 5, the structure shown in FIG. 4 is subjected to a thinning process that includes a series of oxidation and etching steps wherein the etching is a selective etch that removes oxide. This step serves to thin the exposed top semiconductor layer 16 of the initial substrate 10 to provide a region of top semiconductor 16' having a thickness from about 5 to about 25 nm.

Figure 6:
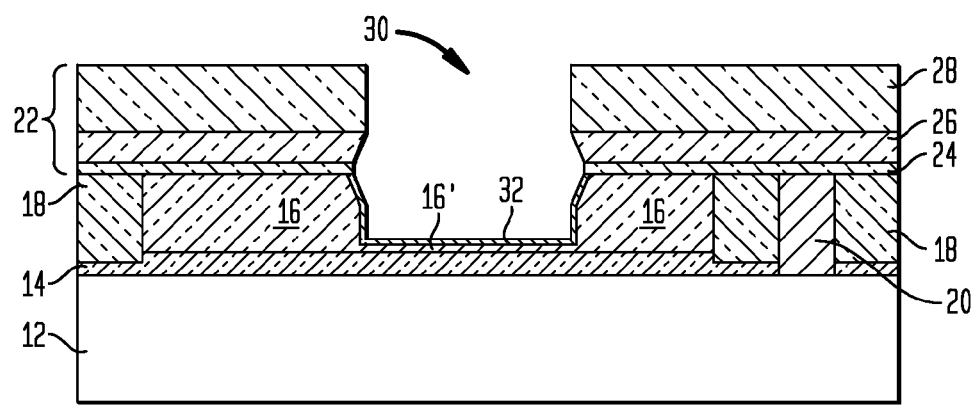
FIG. 6 is a pictorial representation (through a cross sectional view) illustrating the structure of FIG. 5 after forming a sacrificial oxide on at least the thinned substrate.

After performing the thinning step shown in FIG. 5, a sacrificial oxide 32 is formed within the opening 30 on all exposed surfaces (including sidewalls and bottom wall) of the top semiconductor layer 16. The structure including the sacrificial oxide 32 is shown, for example, in FIG. 6. The sacrificial oxide 32 is formed utilizing a thermal oxidation process and it typically has a thickness of less than about 5 nm, with a thickness from about 1 to about 2 nm being even more typical.

Figure 7:
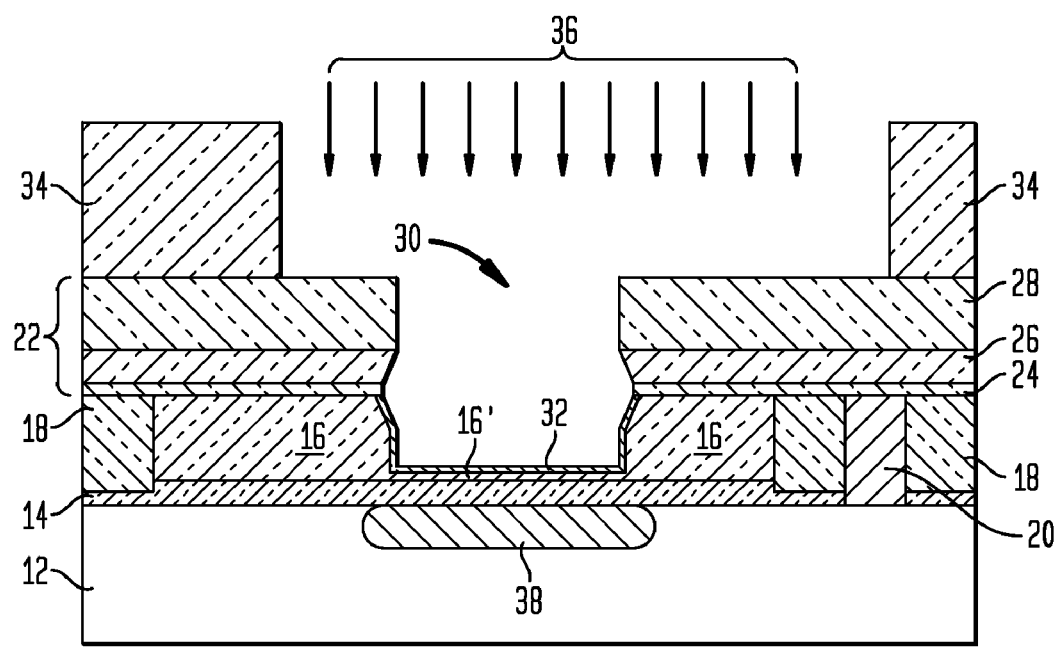
FIG. 7 is a pictorial representation (through a cross sectional view) illustrating the structure of FIG. 6 during implantation of a first well region which is the self-aligned back-gate conductor of the present invention.

After sacrificial oxide 32 growth, a patterned mask 34 is formed on the upper surface of the material stack 22 utilizing conventional deposition and lithography. The patterned mask 34, which has an opening that has a lateral width greater than the opening 30, is used in forming well regions within the substrate 10. FIG. 7 shows the structure during implantation of a first well region. Reference numeral 36 is used to denote ions being implanted into the substrate, while reference numeral 38 denotes the first well region that is formed. In accordance with the present invention, the first well region 38 serves as the back-gate conductor of the inventive structure. The ions 36 used in this step of the present invention are of a second conductivity type that is different from the first conductivity type present in the initial substrate. Typically, the ions 36 are implanted to provide a first well region 38 that is heavily doped. By "heavily doped" it is meant a concentration of said second conductivity type ion from about $1\times10^{19}$ to about $1\times10^{21}$ atoms/$cm^3$. The ions 26 are implanted utilizing conditions, e.g., energy, that are sufficient to penetrate through the top semiconductor layer 16 and 16'; and the buried insulating layer 14 into the bottom semiconductor layer 12. A typical implant energy that can be used in the present invention includes a range from about 0.2 to about 2 keV.

Figure 8:
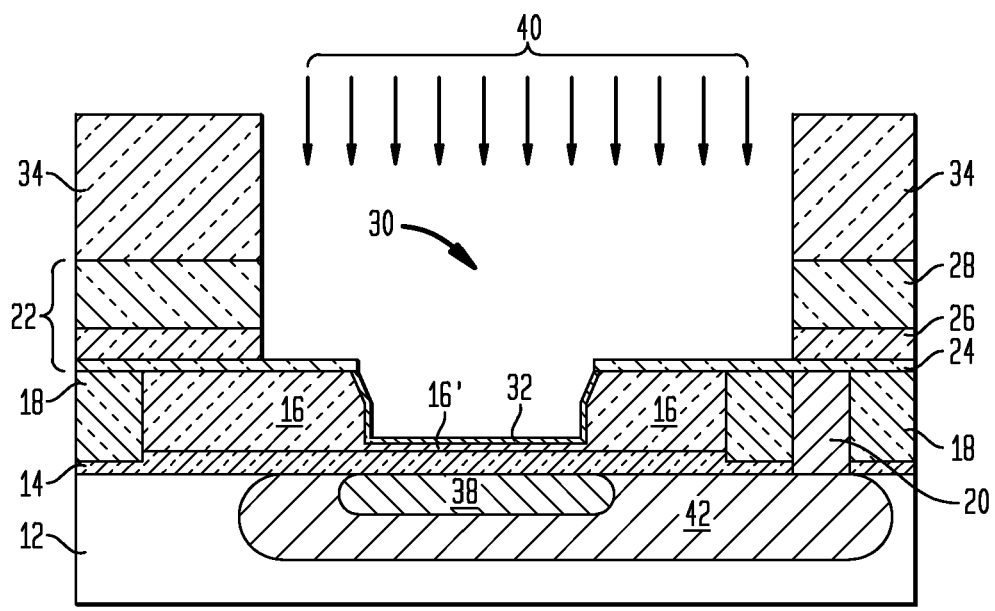
FIG. 8 is a pictorial representation (through a cross sectional view) illustrating the structure of FIG. 7 during implantation of a second well region.

Following the formation of the first well region 38 and with the patterned mask 34 in place, exposed portions of the material stack 22, e.g., the upper insulator 28 and the polysilicon layer 26, not protected by the patterned mask 34, are removed utilizing an etching process such as reactive ion etching. Next, and as shown in FIG. 8, a second well region 42 is formed by implanting ions 40 into the substrate though opening 30. The second well region 42 has a doping concentration of second conductivity type ions that is less than the concentration of second conductivity ions in the first well region 38. Typically, the second well region 42 has a dopant concentration of about $5\times10^{18}$ atoms/$cm^3$ or less. The energy used in this implant step is sufficiently great so as to penetrate the entire film stack comprising layers 28, 26, and 24, thereby reaching the top semiconductor layer 16 that is beneath this stack. Thus, energies for this step may range from 40 keV to above 200 keV, depending on the exact thickness employed for the stack.

Figure 9:
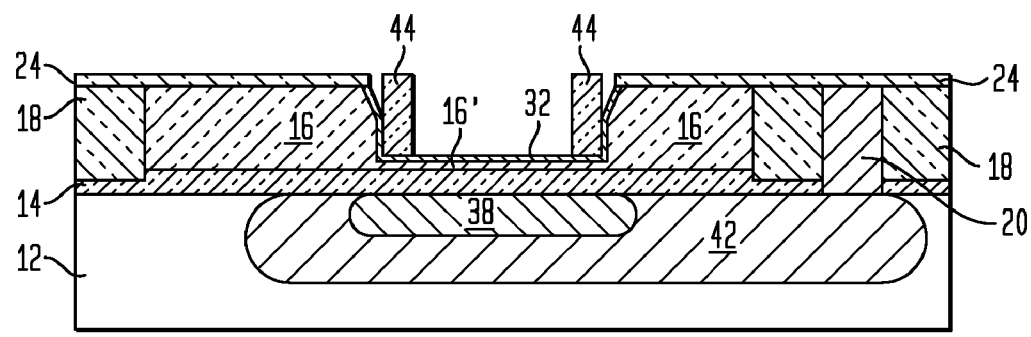
FIG. 9 is a pictorial representation (through a cross sectional view) illustrating the structure of FIG. 8 after a spacer is formed within the opening on each exposed sidewall of the upper surface of the substrate.

Following the formation of both well regions 38 and 42, the patterned mask 36 is removed from the structure utilizing a conventional stripping process and thereafter the upper insulator 28 and the polysilicon layer 26 of the material stack 22 are removed stopping atop the lower insulator 24. Layers 28 and 26 are removed utilizing a conventional planarization process such as, for example, CMP. Next, a spacer 44, as shown in FIG. 9, is formed within the opening 30 atop the sacrificial oxide 32. The spacer 44 is formed by deposition and etching. The spacer 44 is comprised of an insulating material including, for example, an oxide, nitride, oxynitride or any combination thereof. Preferably, the spacer 44 is comprised of a nitride such as $Si_3N_4$.

Following spacer 44 formation, the exposed portions of the sacrificial oxide 32 are removed to expose the underlying surface of the thinned top semiconductor layer 16'. This step of the present invention comprises a wet etching process that selectively removes oxide. The resultant structure formed after removing the exposed portion of sacrificial oxide 32 within opening 30 that are not protected by spacer 44 is shown in FIG. 10.

Figure 10:
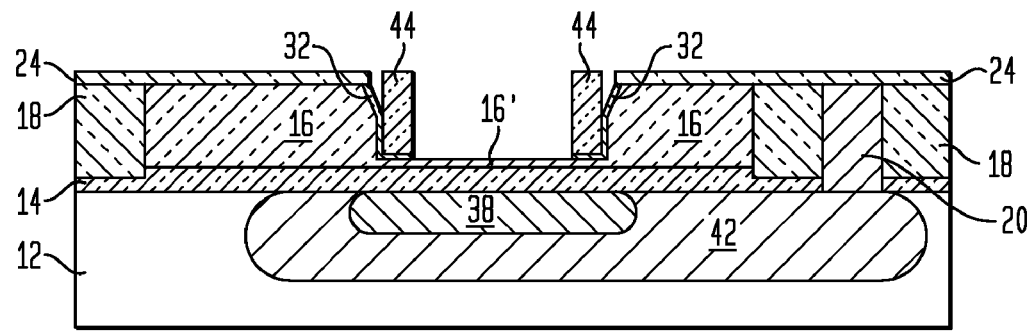
FIG. 10 is a pictorial representation (through a cross sectional view) illustrating the structure of FIG. 9 after performing a wet etching process that removes exposed portions of the sacrificial oxide.
Figure 11:
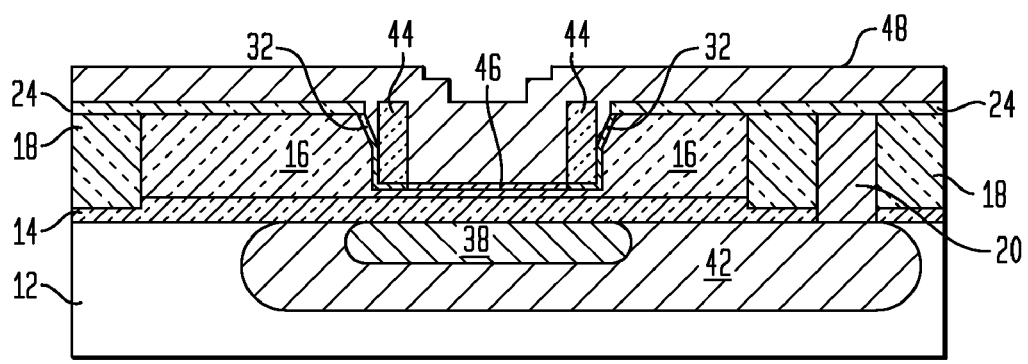
FIG. 11 is a pictorial representation (through a cross sectional view) illustrating the structure of FIG. 10 after forming a gate dielectric and a front gate conductor within the opening.

FIG. 11 shows the structure after formation of gate dielectric 46 and front gate conductor 48 on the structure of FIG. 10. As shown, both the gate dielectric 46 and the front gate conductor 48 are formed within the opening 30 and a portion of the front gate conductor 48 is also formed outside of the opening 30. The gate dielectric 46 can be formed by a thermal growing process or, alternatively, by a conventional deposition process such as CVD or PECVD. The gate dielectric 46 is a thin layer having a thickness that is from about 1 to about 5 nm. The gate dielectric 46 may be composed of a conventional oxide such as, but not limited to: $SiO_2$, $SiO_xN_y$, $Al_2O_3$, $Ta_2O_{TiO2}$ or a mixed metal oxide, e.g., a perovskite-type oxide. The gate dielectric 46 may also comprise a stack of more that one of the aforementioned dielectric materials.

The front gate conductor 48 is formed on the gate dielectric 46 utilizing a conventional deposition process such as, for example, CVD or PECVD. The front gate conductor 48 may comprise a doped Si-containing layer, i.e., doped polySi or doped SiGe, a conductive metal, an alloy including a conductive metal, a conductive metal silicide, a conventional metal nitride or any combination thereof. Typically, the front gate conductor 48 is comprised of polysilicon. When Si-containing layers are used, the Si-containing layer can be doped in-situ or following deposition utilizing ion implantation and annealing.

Figure 12:
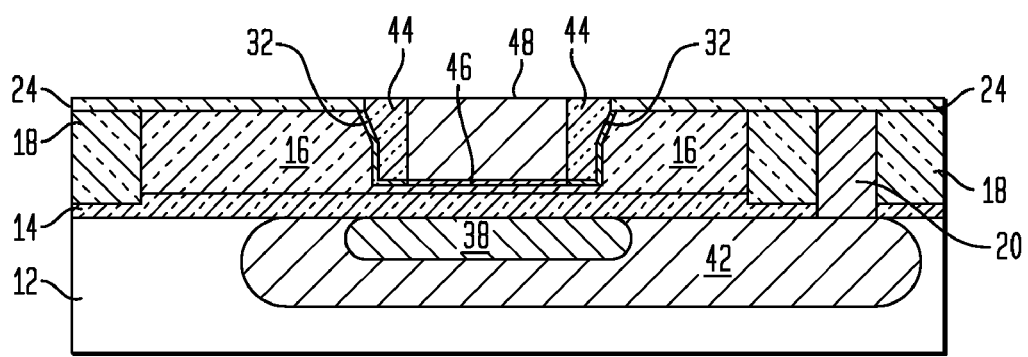
FIG. 12 is a pictorial representation (through a cross sectional view) illustrating the structure of FIG. 11 after performing a planarization step.

After forming the gate dielectric 46 and the front gate conductor 48, the structure shown in FIG. 11 is planarized by CMP or another like planarization process such as an etch back process, to provide the structure shown in FIG. 12. It is observed that both the gate dielectric 46 and the front gate conductor 48 are located only within the opening 30 after this planarization step.

Figure 13:
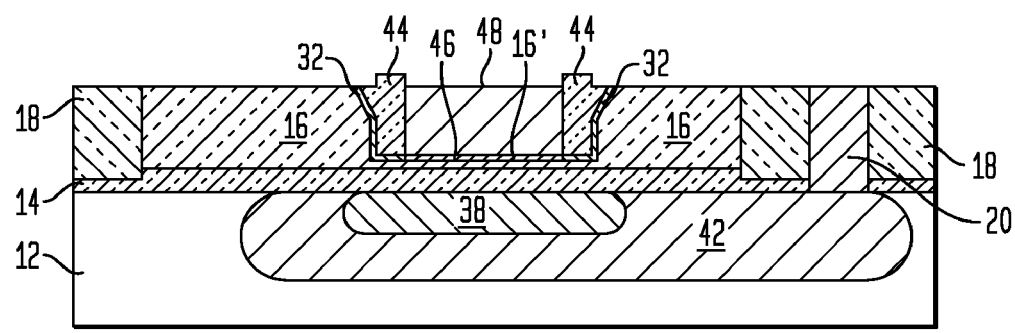
FIG. 13 is a pictorial representation (through a cross sectional view) illustrating the structure of FIG. 12 after performing a selective recess etching process.

Next, the lower insulator 24 is removed from the structure utilizing a conventional etching process that selectively removes the lower insulator 24 and thereafter a recess etch is performed to recess at least the front gate conductor 38 and optionally a portion of the top semiconductor layer 16 from the planarized structure. The structure that is formed after these steps have been performed is shown in FIG. 13.

Figure 14:
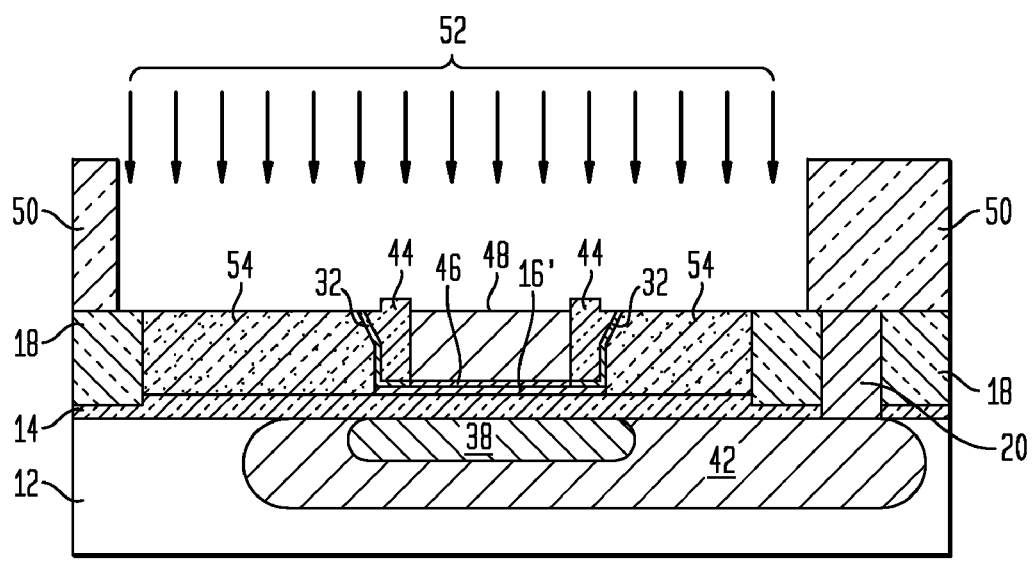
FIG. 14 is a pictorial representation (through a cross sectional view) illustrating the structure of FIG. 13 during implantation of the source/drain regions within the substrate.

A second patterned mask 50 is then formed on the surface of the structure utilizing conventional deposition, lithography and thereafter source/drain regions 54 are formed by implanting ions 52 into the exposed top semiconductor layer 16. The structure during the step of the present invention is shown in FIG. 14. The steps can be repeated to form source/drain regions for nFETs or pFETs, if both are present.

Figure 15:
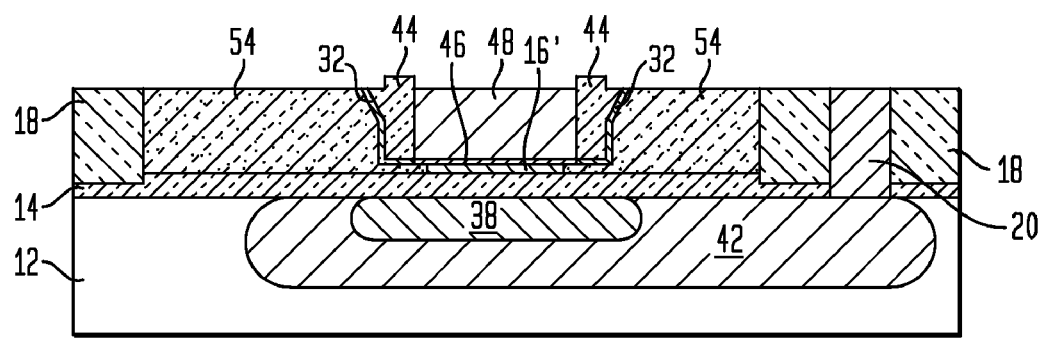
FIG. 15 is a pictorial representation (through a cross sectional view) illustrating the structure of FIG. 14 after performing an activation anneal process.

FIG. 15 shows the structure after removing the patterned mask 50, and after performing an activation anneal. The conditions for the activation anneal are well known in the art and can vary depending on whether a furnace anneal, a laser anneal, a spike anneal or a rapid thermal anneal is used. Typically, the dopants within the source/drain regions 54 are activated by a rapid thermal anneal that is performed at a temperature of greater than 900° C. for a time period of about 10 seconds or less.

Figure 16:
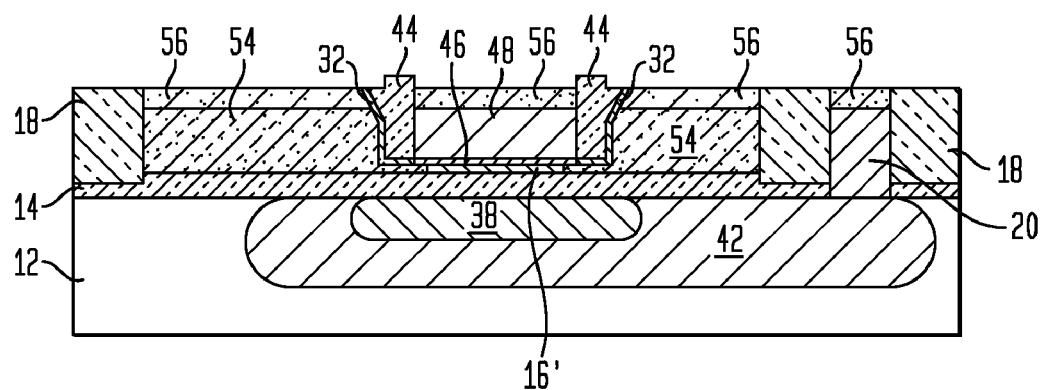
FIG. 16 is a pictorial representation (through a cross sectional view) illustrating the structure of FIG. 15 after silicide formation.

FIG. 16 shows the structure after silicide 56 formation. The silicide 56 forms on all exposed surfaces that contain silicon. The silicide 56 is formed utilizing a conventional silicidation process in which a silicide metal such as, for example, Ti, Co, W, or Ni, is formed on the surface of the structure by a conventional deposition process. Following the deposition of the silicide metal, a single anneal step that is capable of causing a metal silicide to form is performed. Remaining metal not reacted with silicon is then removed by a selective etching process and a second optional anneal can be performed. The first anneal is typically performed at a lower temperature than the optional second anneal. In embodiments in which the front gate conductor 48 is not comprised of a Si-containing material, silicide 56 does not form thereon unless a source of silicon is first provided.

Figure 17:
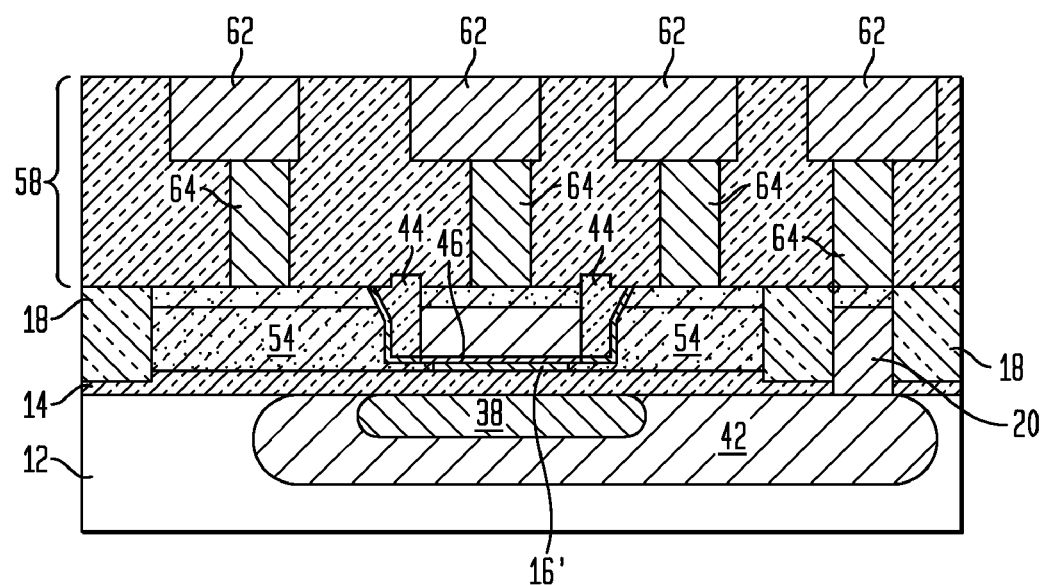
FIG. 17 is a pictorial representation (through a cross sectional view) illustrating the structure of FIG. 16 after interconnect formation.

FIG. 17 shows the structure after interconnect 58 formation. The interconnect 58 is formed utilizing conventional techniques well known to those skilled in the art. This includes deposition of an interlevel dielectric 60, providing lines 62 and vias 64 within the interlevel dielectric and filling said lines and vias with a conductive metal such as, for example, doped polysilicon, W, Al, or Cu. In FIG. 17, the labels drain, gate, source, and back-gate refer to the contacts formed to each of those regions.

It is observed that FIGS. 15-17 include the planar back-gate CMOS structure of the present invention. In broad terms and as stated above, the planar back-gate structure includes a substrate 10 having a back-gate conductor 38 whose lateral dimension is substantially defined, e.g., self-aligned, by an opening 30 located in an upper surface of said substrate; a front gate conductor 48 having a portion thereof that is located within the opening 30; and source/drain regions 54 located adjacent to opposite sides of the front gate conductor 48.

While the present invention has been has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

What is claimed is:

1. A method of forming a planar back-gate CMOS structure comprising:
   providing a semiconductor-on-insulator (SOI) substrate including a bottom semiconductor layer, a buried insulating layer, and a top semiconductor layer;
   forming an opening in an upper surface of said top semiconductor layer;
   forming a dopant region in said bottom semiconductor layer by implanting dopants through said opening, said dopant region defining a back-gate conductor; and
   forming a front gate conductor having at least a portion thereof within said opening.

2. The method of claim 1 further comprising forming source/drain regions in said upper surface of said top semiconductor layer, said source/drain regions are located adjacent to opposite sides of said front gate conductor.

3. The method of claim 1, wherein a region of said top semiconductor layer within said opening is thinned to a thickness from about 5 to about 25 nm by oxidation and etching.

4. The method of claim 1, further comprising forming at least one trench isolation region and a trench contact within said SOI substrate prior to forming said opening.

5. The method of claim 1, wherein said opening in said upper surface of said top semiconductor layer is formed by
   (i) providing a material stack on said SOI substrate,
   (ii) forming a patterned mask on said material stack, said patterned mask having another opening that exposes said material stack, and
   (iii) etching exposed portions of said material stack to expose a portion of said top semiconductor layer, wherein said etching removes a surface portion of said top semiconductor layer.

6. The method of claim 5, further comprising a thinning step, wherein said thinning step thins said exposed portion of said top semiconductor layer to a thickness within a range from about 5 to about 25 nm.

7. The method of claim 1, wherein said bottom semiconductor layer is doped with dopant of a first conductivity type, wherein said dopant region is formed by ion implanting a second conductivity type dopant within said bottom semiconductor layer through said opening, wherein said dopant region having a dopant concentration from about $10^{19}$ to about $10^{21}$ atoms/cm$^3$, and wherein said second conductivity type is different from said first conductivity type.

8. The method of claim 1, further comprising forming a second dopant region about said back-gate conductor, wherein said bottom semiconductor layer is doped with dopant of a first conductivity type, wherein said second dopant region has a dopant concentration that is less than that of said back-gate conductor, and wherein said second conductivity type is different from said first conductivity type.

9. The method of claim 2, further comprising forming a silicide atop said source/drain regions.

10. The method of claim 1, further comprising forming an interconnect structure on said top semiconductor layer, said interconnect structure including an interlevel dielectric having conductively filled vias and lines located therein.

11. The method of claim 9, further comprising forming another silicide atop said front gate conductor.

* * * * *